(12) United States Patent
O'Meara et al.

(10) Patent No.: US 7,479,454 B2
(45) Date of Patent: Jan. 20, 2009

(54) METHOD AND PROCESSING SYSTEM FOR MONITORING STATUS OF SYSTEM COMPONENTS

(75) Inventors: David L. O'Meara, Poughkeepsie, NY (US); Daniel Craig Burdett, West Park, NY (US); Stephen H. Cabral, Pine Plains, NY (US); Gert Leusink, Saltpoint, NY (US); John William Kostenko, LaGrangeville, NY (US); Cory Wajda, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 660 days.

(21) Appl. No.: 10/674,703

(22) Filed: Sep. 30, 2003

(65) Prior Publication Data

US 2005/0070104 A1    Mar. 31, 2005

(51) Int. Cl.
    *H01L 21/302* (2006.01)
(52) U.S. Cl. .................................... 438/689; 216/67
(58) Field of Classification Search ................ 438/689, 438/7; 356/72–73, 300, 632, 311; 250/458.1, 250/492.2; 216/60, 67
    See application file for complete search history.

(56) References Cited

U.S. PATENT DOCUMENTS

| | | | |
|---|---|---|---|
| 5,146,098 A * | 9/1992 | Stack | 250/492.2 |
| 5,187,542 A * | 2/1993 | Madzsar | 356/300 |
| 5,712,702 A * | 1/1998 | McGahay et al. | 356/311 |
| 5,798,016 A * | 8/1998 | Oehrlein et al. | 156/345.37 |
| 5,947,053 A * | 9/1999 | Burnham et al. | 116/208 |
| 5,989,928 A * | 11/1999 | Nakata et al. | 438/7 |
| 6,379,575 B1 * | 4/2002 | Yin et al. | 216/67 |
| 6,436,303 B1 * | 8/2002 | Kim et al. | 216/67 |

(Continued)

FOREIGN PATENT DOCUMENTS

WO       WO99/64814       12/1999

(Continued)

OTHER PUBLICATIONS

Martin Spartz, *Exhaust Gas Analysis Helps to Reduce Costs*, Semiconductor International, p. 52-55, Dec. 2003.

*Primary Examiner*—Keith D. Hendricks
*Assistant Examiner*—Patricia A George
(74) *Attorney, Agent, or Firm*—Wood, Herron & Evans, LLP (57) ABSTRACT

A method and system for monitoring status of a system component during a process. The method includes exposing a system component to a reactant gas during a process, where the reactant gas is capable of etching the system component material to form an erosion product, and monitoring release of the erosion product during the process to determine status of the system component. Processes that can be monitored include a chamber cleaning process, a chamber conditioning process, a substrate etching process, and a substrate film formation process. The system component can be a consumable system part such as a process tube, a shield, a ring, a baffle, an injector, a substrate holder, a liner, a pedestal, a cap cover, an electrode, and a heater, any of which can further include a protective coating. The processing system includes the system component in a process chamber, a gas injection system for introducing the reactant gas, a chamber protection system for monitoring the status of the system component, and a controller for controlling the processing system in response to the status.

20 Claims, 6 Drawing Sheets

U.S. PATENT DOCUMENTS

| | | | |
|---|---|---|---|
| 6,592,817 B1 * | 7/2003 | Tsai et al. | 422/62 |
| 6,677,549 B2 * | 1/2004 | Suzuki et al. | 219/121.41 |
| 6,750,977 B2 * | 6/2004 | Otsubo et al. | 356/632 |
| 6,852,242 B2 * | 2/2005 | Sun et al. | 216/60 |
| 6,872,322 B1 * | 3/2005 | Chow et al. | 216/67 |
| 6,894,769 B2 * | 5/2005 | Ludviksson et al. | 356/72 |
| 2002/0149001 A1 * | 10/2002 | Ellens et al. | 252/301.4 S |
| 2004/0125360 A1 * | 7/2004 | Ludviksson et al. | 356/72 |

FOREIGN PATENT DOCUMENTS

| | | |
|---|---|---|
| WO | WO 02/065511 | 8/2002 |
| WO | WO 03/020449 | 3/2003 |
| WO | WO 03/026774 | 4/2003 |
| WO | WO 03/063196 | 7/2003 |

* cited by examiner

METHOD AND PROCESSING SYSTEM FOR MONITORING STATUS OF SYSTEM COMPONENTS

FIELD OF THE INVENTION

The present invention relates to chamber processing, and more particularly to monitoring status of system components during a process performed in a processing system.

BACKGROUND OF THE INVENTION

Many semiconductor fabrication processes are performed in process chambers such as plasma etch chambers, plasma deposition chambers, thermal processing chambers, chemical vapor deposition chambers, atomic layer deposition chambers, etc. Processing of substrates can lead to formation of material deposits on system components in the process chamber. Periodic dry cleaning of the process chambers can be carried out to remove the chamber deposits, where the cleaning process can require removal of different material deposits from the system components.

Various parts of a processing system can consist of consumable or replaceable system components that can, for example, be fabricated from quartz, silicon, alumina, carbon, or silicon carbide. The consumable nature of the replaceable components can require frequent maintenance of the processing system. Consumable system parts are commonly replaced or cleaned after film accumulation can threaten particle problems, in between incompatible processes to be run in sequence, after detrimental processing conditions, or after poor processing results are observed. Alternately, consumable system parts can be cleaned or replaced according to a predetermined maintenance schedule that can, for example, be based on the number of operating hours. These methods can result in overdue or premature replacement of consumable system components. Furthermore, the length of a cleaning process can be based on a fixed time period that has been proven to result in adequate cleaning of system components. However, because the cleaning process is not actually monitored, or a non-standard amount of deposition can accumulate before the clean is necessary, the fixed time period may be unnecessarily long and result in undesired etching (erosion) of the system components.

Chamber conditioning processes (also referred to as passivation processes) are commonly implemented in semiconductor fabrication to prepare process chambers for optimal performance. For example, chamber conditioning processes may be carried out following chamber cleaning, after an extended chamber idle period, or before a first chamber production process. When used with plasma chambers, chamber conditioning processes typically involve using a "conditioning plasma" in the plasma chamber for a predetermined length of time to prepare, or "condition", the chamber for the performance of plasma processes with production wafers. The parameters of the conditioning process (e.g., RF power, chamber and substrate temperature, feed gas composition, an pressure) are usually maintained at or near the parameters of the corresponding production process for which the chamber is being conditioned. In this manner, conditioning processes can help ensure that all processes performed in a process chamber produce results with in a desired range.

Conditioning processes can be performed on several wafers or sets of wafers. The extent of conditioning can be monitored by periodically analyzing the wafers during the conditioning procedure to determine process compliance. However, conditioning processes that are carried out for long time periods can involve the use of a large number of test wafers, which result in large startup expenses. Alternately, the extent of conditioning can be carried out for a fixed time period that has been proven to provide production process compliance. However, because the effectiveness of the conditioning process in not actually monitored, the fixed time period may be unnecessarily long in order to account for varying conditioning times required to achieve process compliance for different runs of a conditioning process. This can result in unacceptable reduction in throughput for the chamber.

SUMMARY OF THE INVENTION

A method is provided for monitoring status of a system component in a processing system by exposing a system component to a reactant gas during a process, wherein the reactant gas is capable of etching the system component material to form an erosion product, and monitoring the processing system for release of the erosion product during the process to determine status of the system component. The process can include a chamber cleaning process, a chamber conditioning process, a substrate etching process, and a substrate deposition process.

A processing system is provided that allows monitoring status of a system component during processing. The processing system includes a process chamber, a system component, a gas injection system configured for introducing a reactant gas in the process chamber, wherein the reactant gas is capable of etching the system component material to form an erosion product during a process, a chamber protection system for monitoring the processing system for release of the erosion product to determine status of the system component, and a controller configured to control the processing system.

The system component can contain a consumable system part such as a process tube, a shield, a ring, a baffle, an injector, a substrate holder, a liner, a pedestal, a cap cover, an electrode, and a heater, and can further contain a protective coating. The chamber protection system can include an optical monitoring system for detecting light absorption or a mass sensor to detect a mass signal from the erosion product.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1A:
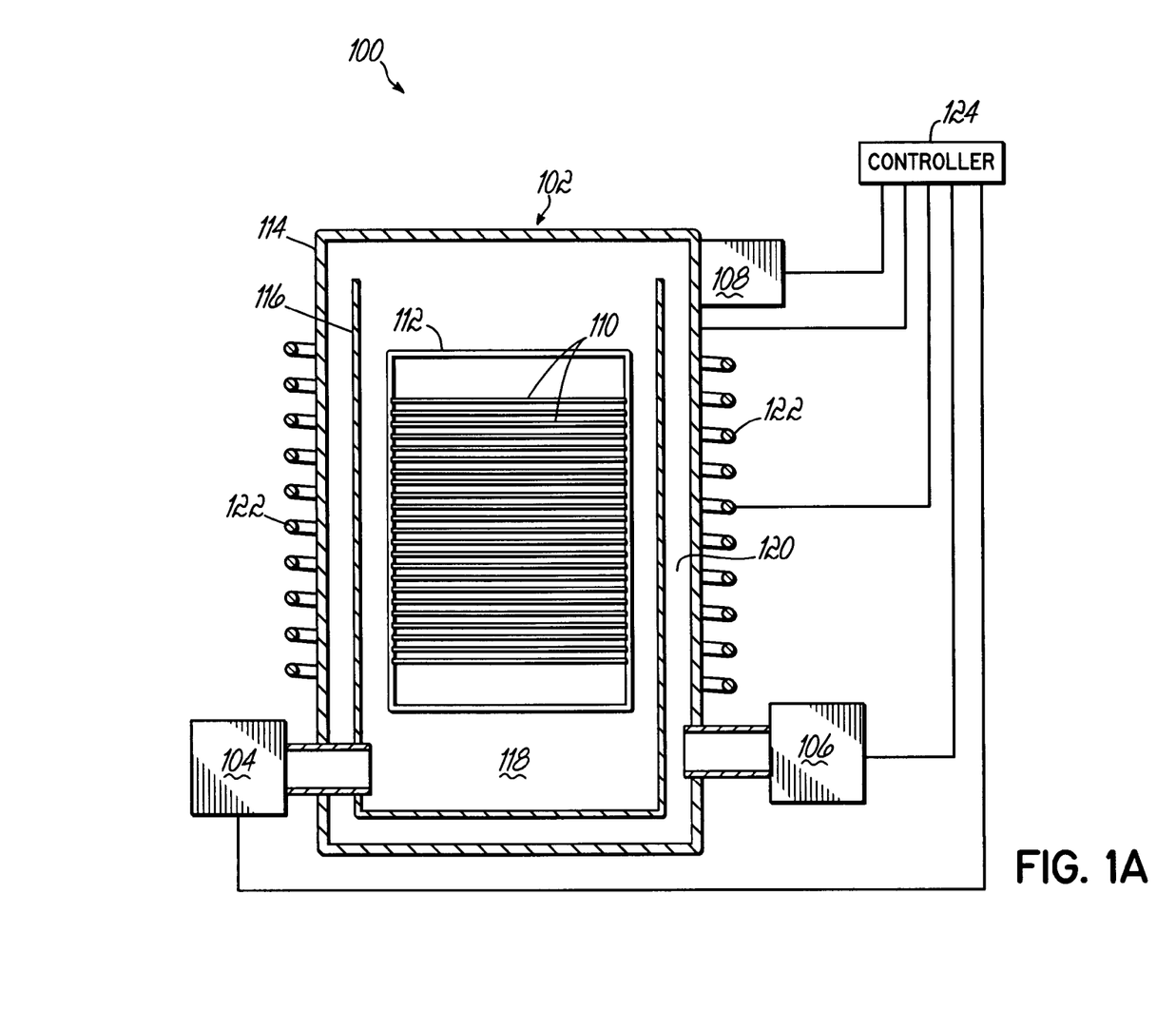
FIG. 1A shows a schematic diagram of a processing system in accordance with an embodiment of the invention.

FIG. 1A shows a schematic diagram of a processing system according to an embodiment of the invention. The batch type processing system 100 can, for example, be a thermal processing system, a plasma processing system capable of sustaining a plasma, a chemical vapor deposition processing system, or an atomic layer deposition system. As illustrated in FIG. 1, the batch type processing system 100 comprises a process chamber 102, a gas injection system 104, a heater 122, a vacuum pumping system 106, a chamber protection system 108, and a controller 124. Multiple substrates 110 can be loaded into the process chamber 102 and processed using substrate holder 112. Furthermore, the process chamber 102 comprises an outer section 114 and an inner section 116. In one embodiment of the invention, the inner section 116 can include a process tube (not shown).

The gas injection system 104 can introduce gases into the process chamber 102 for purging the process chamber 102, for preparing the process chamber 102, for cleaning the process chamber 102, and for processing the substrates 110. A plurality of gas injector lines (not shown) can be arranged to flow gases into the process chamber 102. The gases can be introduced into volume 118, defined by the inner section 116, to expose substrates 110 thereto. Thereafter, the gases can flow into the volume 120, defined by the inner section 116 and the outer section 114, to be exhausted from the process chamber 102 by the vacuum pumping system 106.

Substrates 110 can be loaded into the process chamber 102 and processed using the substrate holder 112. The batch type processing system 100 can allow for a large number of tightly stacked substrates 110 to be processed, thereby resulting in high substrate throughput. A substrate batch size can, for example, be about 100 substrates (wafers), or less. Alternately, the batch size can be about 25 substrates, or less. The processing system 100 can be configured to process substrates of various sizes, for example 200 mm substrates, 300 mm substrates, or larger substrates. The substrates 110 can, for example, comprise semiconductor substrates (e.g., Si or compound semiconductor), LCD substrates, and glass substrates. In addition to clean substrates, substrates with thin interfacial films formed thereon can be utilized, including but not limited to, oxide films (native or thermal oxides), nitride films, oxynitride films, and mixtures thereof. The thin interfacial films can, for example, be a few angstrom (A) thick and can be formed in a self-limiting process at low process pressure.

The batch type processing system 100 can be controlled by a controller 124 capable of generating control voltages sufficient to control the batch type processing system 100 as well as monitor outputs from the batch type processing system 100. Moreover, the controller 124 can be coupled to and exchange information with process chamber 102, gas injection system 104, heater 122, chamber protection system 108, and vacuum pumping system 106. For example, a program stored in the memory of the controller 124 can be utilized to control the aforementioned components of the batch type processing system 100 according to a desired process, and to perform any functions associated with monitoring the process. One example of controller 124 is a DELL PRECISION WORKSTATION610™, available from Dell Corporation, Dallas, Tex.

Real-time process monitoring can be carried out using chamber protection system 108. The chamber protection system 108 can be positioned to monitor the gaseous environment in the process chamber 102. Alternately, the chamber protection system 108 can be positioned to monitor the process chamber effluent. In general, the chamber protection system 108 is a versatile monitoring system and can, for example, comprise a mass sensor (mass spectrometer) or an optical monitoring system (e.g., a Fourier Transform Infrared (FTIR) spectrometer) for monitoring light absorption by a process gas and reaction by-products. The chamber protection system 108, which is a process monitoring system, can provide qualitative and quantitative analysis of the gaseous environment in process chamber 102. Process parameters that can be monitored using the chamber protection system 108 include process gas flows, gas pressure, ratios of gaseous species, gas purities, and reaction by-products including etch products.

A mass sensor is a readily available instrument for detection, identification, and monitoring of a gaseous environment in the processing system and method of the present invention. A mass sensor can offer extreme sensitivity for detecting trace amounts of gaseous substances. Due to the relatively high pressure at the process monitoring point of a typical process, the gas sampling can include a pressure reduction system. The pressure reduction can be carried out using a length of capillary tube or a throttle valve, and the mass sensor itself can be pumped continuously. Infra-red spectroscopy is a well-established analytical method for measuring light absorption of gases and is ideal for semiconductor process monitoring, because it can be used in both vacuum or non-vacuum environments and can provide a wealth of valuable information during a process.

Figure 1B:
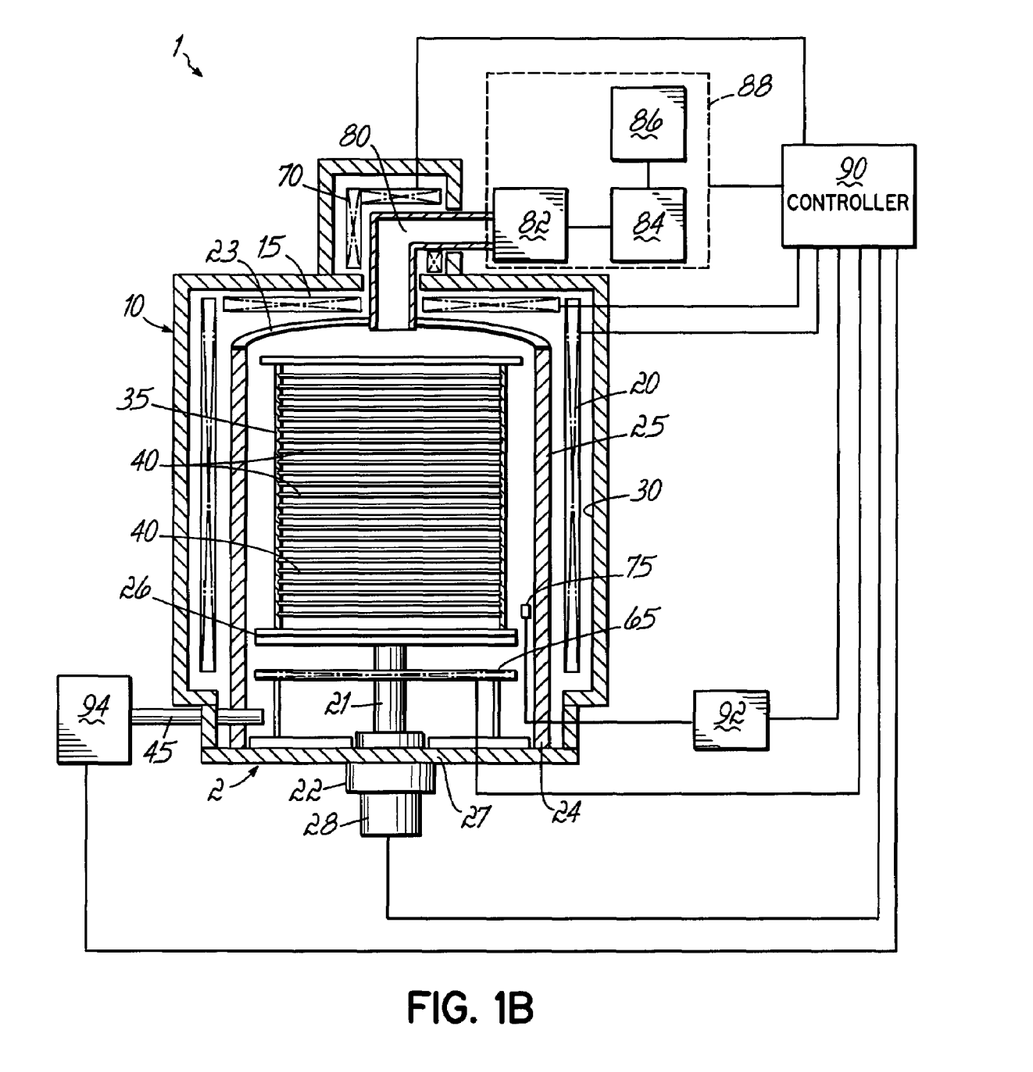
FIG. 1B shows a schematic diagram of another processing system in accordance with an embodiment of the invention.

FIG. 1B shows a schematic diagram of a processing system 1 in accordance with an embodiment of the invention. The batch type processing system 1 can, for example, be a thermal processing system or, alternately, the batch type processing system can be a plasma processing system capable of sustaining a plasma. The batch type processing system 1 contains a process chamber 10 with a process tube 25 therein that has an upper end 23 connected to an exhaust pipe 80, and a lower end 24 hermetically joined to a lid 27 of a cylindrical manifold 2, which includes those components of system 1 residing within process tube 25 and removable therefrom, as well as the lid 27 and its operating components. The exhaust pipe 80 discharges gases from the process tube 25 to a vacuum pumping system 88, discussed in further detail below, to maintain a predetermined atmospheric or below atmospheric pressure in the processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotatable shaft 21 penetrating the lid 27 and driven by a motor 28. The turntable 26 can be rotated during processing to improve overall film uniformity or, alternately, the turntable 26 can be stationary during processing. The lid 27 is mounted on an elevator 22 for transferring the substrate holder 35 in and out of the reaction tube 25. When the lid 27 is positioned at its uppermost position, as shown in FIG. 1B, the lid 27 is adapted to close the open end of the manifold 2.

The processing system 1 can further include a pedestal (not shown) to provide thermal insulation between the substrate holder 35 and the manifold 2. In addition, the processing system 1 can further include a cap cover (not shown) to protect the lid 27 from the processing environment. The pedestal and cap cover can, for example, be made of quartz or SiC.

A plurality of gas injector lines 45 can be arranged around the manifold 2 to supply a plurality of gases into the process tube 25 through the gas injector lines 45. In FIG. 1B, only one gas injector line 45 among the plurality of possible gas injector lines is shown. The gas injector line 45 is connected to a gas injection system 94. The process chamber 10 has a mirror-finished inner surface 30 to suppress dissipation of radiation heat radiated by main heater 20, bottom heater 65, top heater 15, and exhaust pipe heater 70. A helical cooling water passage (not shown) is formed within the wall of process chamber 10 as a cooling medium passage.

The vacuum pumping system 88 comprises a vacuum pump 86, a trap 84, and an automatic pressure controller (APC) 82. The vacuum pump 86 can, for example, include a dry vacuum pump capable of a pumping speed up to 20,000 liters per second (and greater). During processing, gases can be introduced into the process chamber 10 via the gas injection system 94 and the process pressure adjusted by the APC 82. The trap 84 can collect unreacted precursor material and by-products from the process chamber 10.

In accordance with the present invention, the chamber protection system 92 can be positioned to monitor the gaseous environment in the process chamber 10. Alternately, the chamber protection system 92 can be positioned to monitor the process chamber effluent. The chamber protection system 92 includes a sensor 75 capable of real-time process monitoring and can, for example, comprise a MS or a FTIR spectrometer. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to and can exchange information with gas injection system 94, motor 28, chamber protection system 92, heaters 20, 15, 65, and 70, and vacuum pumping system 88.

It is to be understood that the processing systems 1, 100 in FIGS. 1A and 1B are for exemplary purposes only, as many variations of the specific hardware and software can be used to implement systems in which the present invention may be practiced, and these variations will be readily apparent to one having ordinary skill in the art. The processing systems 1, 100 in FIGS. 1A and 1B have system components that can erode or become coated with material deposits during processing. Examples of consumable system components include a process tube, a shield, a ring, a baffle, a gas injector, a wafer boat (substrate holder), a pedestal, a cap cover, and a liner. The system components can be manufactured from a variety of materials, for example ceramic materials such as oxides (e.g., quartz ($SiO_2$) and alumina ($Al_2O_3$)), nitrides (e.g., silicon nitride (SiN)), carbides (e.g., silicon carbide (SiC)), metals (e.g., Al), and metal-containing materials (e.g., steel). A system component can be constructed from a single type of material or, alternately, it can be constructed from more than one type of material.

In another embodiment of the invention, the processing system can include a single wafer processing system, which systems are known in the art. Examples of consumable system components used in single wafer processing systems include electrodes, heaters, shields, rings, baffles, injectors, and liners.

Processing of substrates in a processing system can form a material deposit on a system component. A material deposit can contain one or more types of material, for example silicon (Si), silicon germanium (SiGe), silicon nitride (SiN), silicon dioxide ($SiO_2$), doped silicon, and dielectric materials including high-k metal oxides such as $HfO_2$, $HfSiO_x$, $ZrO_2$, $ZrSiO_x$, where k refers to the dielectric constant. Monitoring etch products from the etching of many different material deposits can be unpractical due to the large number of etch products than can require monitoring.

In one embodiment of the invention, a processing system can contain a system component having a protective coating. A protective coating can, for example, protect a consumable system component from the processing environment during a process, and increase the lifetime of the consumable system component. A protective coating can be deposited on a system component in-situ, for example during a chamber conditioning process, or, alternatively, a protective coating can be predeposited on the system component during manufacturing of the system component. A protective coating can, for example, include SiN, SiC, $SiO_2$, $Y_2O_3$, $Sc_2O_3$, $Sc_2F_3$, $YF_3$, $La_2O_3$, $CeO_2$, $Eu_2O_3$, $DyO_3$, $SiO_2$, MgO, $Al_2O_3$, ZnO, $SnO_2$, and $In_2O_3$. The method and system of the present invention may be used to monitor the status of the system component during formation of the protective coating during a chamber conditioning system, or during removal of a deposit formed on the protective coating during a chamber cleaning process.

In one embodiment of the invention, a method is provided for monitoring status of a system component in a processing system by exposing the system component to a reactant gas during a process, and monitoring the processing system for release of an erosion product from etching of the system component material during the process to determine status of the system component. The process can include a substrate etching process, a substrate film formation process, a chamber cleaning process, and/or a chamber conditioning process.

Status of a system component can, for example, show a relative amount of a material deposit remaining on a system component during a chamber cleaning process where a material deposit is being removed from the system component, or a relative amount of a material deposit formed on a system component during a substrate etching process, a substrate film formation process, or a chamber conditioning process.

In one embodiment of the invention, the chamber temperature can be between about 100° C. and about 1000° C. during a process. In another embodiment of the invention, the chamber pressure can be between about 10 mTorr and about 760 Torr. In yet another embodiment of the invention, the system component is made of quartz and a chamber cleaning process is operated with a chamber temperature between about 200° C. and about 800° C., for example about 300° C., and a chamber pressure between about 200 mTorr and about 760 Torr, for example about 200 mTorr.

In one embodiment of the invention, a method is provided for monitoring status of a system component during a cleaning process. The cleaning process can include a reactant gas capable of removing a material deposit from a system component and forming an erosion product when exposed to and etching the system component material. In one embodiment of the invention, a system component can contain quartz and the reactant gas can, for example, contain a cleaning gas including a halogen-containing gas (e.g., $ClF_3$, $F_2$, $NF_3$, and HF). The erosion product can contain a silicon-containing erosion product, for example a silicon halide (e.g., $SiF_4$, $SiCl_4$, and $SiBr_4$) or a silicon oxyhalide (e.g., $Si_xO_yX_z$, where X is F, Cl, or Br). The reactant gas can further contain an inert gas selected from at least one of Ar, He, Ne, Kr, Xe, and $N_2$. Thus, when the erosion product from the system component is detected by the monitoring system, the monitoring status indicates that the material deposit removal is complete, or nearing completion, and the controller receives input to stop the cleaning/etching process before any further erosion of the system component.

In another embodiment of the invention, a system component can have a protective coating and the reactant gas can be capable of removing a material deposit (for example a high-k metal oxide) from the system component and forming an erosion product when exposed to and etching the protective coating. In one embodiment of the invention, the protective coating can be SiN and the erosion product can be silicon-containing erosion product or a nitrogen-containing erosion product. The system component can, for example, be manufactured from quartz and contain a SiN protective coating and a high-k material deposit. Thus, when the erosion product from the SiN protective coating is detected by the monitoring system, the monitoring status indicates that the high-k material deposit removal is complete, or nearing completion, and the controller receives input to stop the cleaning/etching process before any further erosion of the system component.

Monitoring of a cleaning process can further include determining if the intensity level of an erosion product from etching of a system component material (or a protective coating on a system component) has reached a threshold value, thereby arriving at a determination of whether the system component has been sufficiently cleaned, and based on the determination, either continuing with the cleaning process or stopping the cleaning process.

In yet another embodiment of the invention, a method is provided for monitoring status of a system component during a conditioning process, a substrate film formation process, or a substrate etch process by monitoring extent of material deposition onto the system component. The reactant gas can contain a chamber conditioning gas for conditioning a chamber, for example a silicon-containing gas such as dichlorosilane (DCS) and a nitrogen-containing gas such as $NH_3$: to form a silicon nitride coating on a system component to passivate and prevent contaminant outgassing; a film formation gas for forming a film on a substrate, for example a nitrogen-containing gas such NO or $N_2O$ for forming an oxide film or an oxynitride film on a substrate; or a silicon-containing gas such as tetraethyl orthosilicate (TEOS) for depositing $SiO_2$ on a substrate; or a substrate etch gas for removing material from a substrate, for example a halogen-containing gas such as HF for $SiO_2$ film removal. The reactant gas can further contain an inert gas selected from at least one of Ar, He, Ne, Kr, Xe, and $N_2$.

Monitoring of a chamber conditioning process, a substrate film formation process, or a substrate etching process can further include determining if the intensity level of an erosion product from etching of a system component material (or a protective coating on a system component) has reached a threshold value, thereby arriving at a determination of the extent of material deposition onto the system component, and based on that determination, either continuing with the process or stopping the process.

Figure 2A:
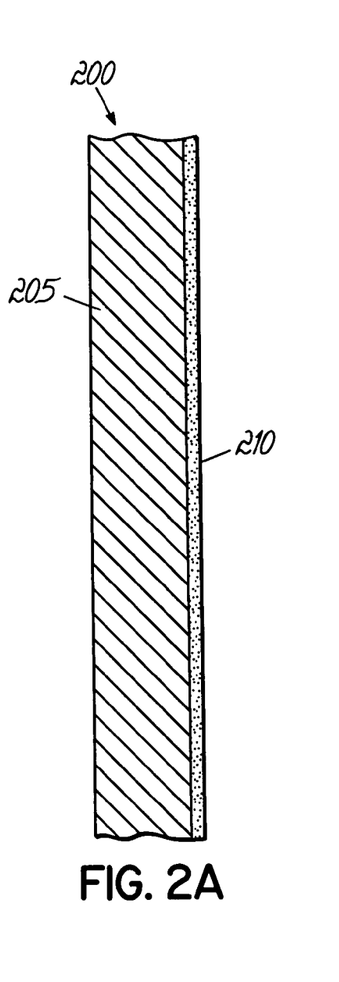
FIG. 2A is a schematic cross-sectional view of a system component containing a material deposit in accordance with an embodiment of the invention.
Figure 2B:
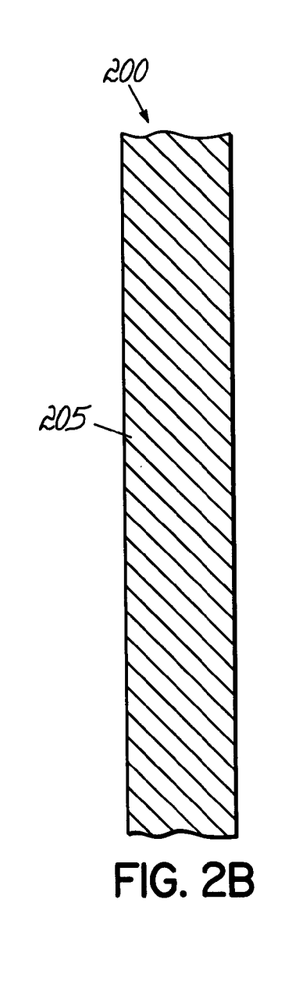
FIG. 2B is a schematic cross-sectional view of a clean system component in accordance with an embodiment of the invention.

FIG. 2A schematically shows a cross-sectional view of a system component 200 containing a material deposit 210 in accordance with an embodiment of the invention. The system component 200 in FIG. 2A can, for example, comprise a process tube, a shield, a ring, a baffle, an injector, a wall, a substrate holder, a liner, a pedestal, a cap cover, an electrode, and/or a heater. The system component 200 can be manufactured from a variety of materials, for example quartz, SiC, $Al_2O_3$, or a metal. The system component 200 in FIG. 2A has a continuous smooth material deposit 210 formed onto the system component material 205. The material deposit 210 can contain one or more types of material, for example Si, SiGe, SiN, $SiO_2$, doped Si, and metal oxides such as $HfO_2$, $HfSiO_x$, $ZrO_2$, and $ZrSiO_x$. FIG. 2B schematically shows a cross-sectional view of a clean system component 200 in accordance with an embodiment of the invention. The material deposit 210 in FIG. 2A has been removed in a cleaning process by exposing the system component material 205 to a reactant gas, resulting in a clean system component 200 in FIG. 2B. The cleaning process has been stopped when the material deposit 210 has been substantially removed from the system component material 205 and before the system component material 205 becomes eroded.

Figure 2C:
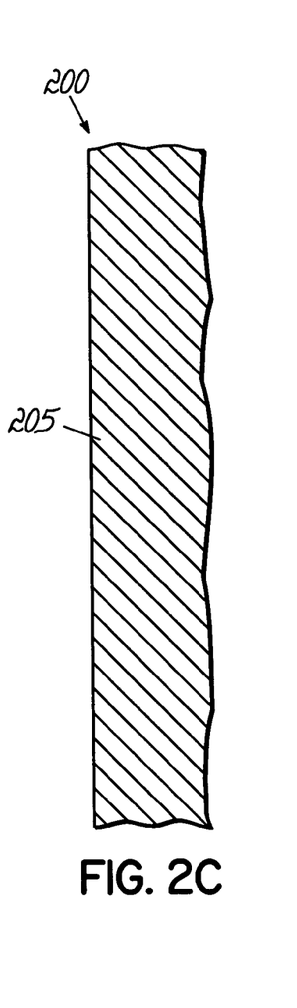
FIG. 2C is a schematic cross-sectional view of an eroded system component in accordance with an embodiment of the invention.

FIG. 2C schematically shows cross-sectional view of an eroded system component in accordance with an embodiment of the invention. The system component 200 in FIG. 2C has been exposed to a longer cleaning process than the system component 200 in FIG. 2B, resulting in moderate erosion of the system component material 205.

Figure 2D:
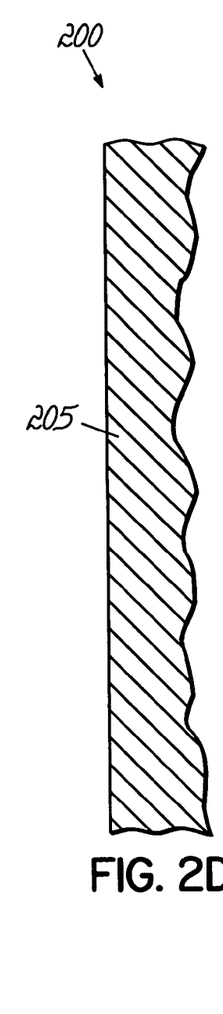
FIG. 2D is a schematic cross-sectional view of another eroded system component in accordance with an embodiment of the invention.

FIG. 2D schematically shows cross-sectional view of another eroded system component in accordance with an embodiment of the invention. The system component 200 in FIG. 2D has been exposed to a longer cleaning process than the system component 200 in FIG. 2C, resulting in increased erosion of the system component material 205.

Referring to FIGS. 2A-2D, the present invention can prevent undesirable erosion of the system component material 205 by monitoring the processing system for release of an erosion product during a process. For example, it can be desirable to stop the process when the material deposit 210 has been substantially removed from the system component material 205, as shown in FIG. 2B, thereby preventing erosion of the system component material 205, as shown in FIGS. 2C and 2D.

Figure 3A:
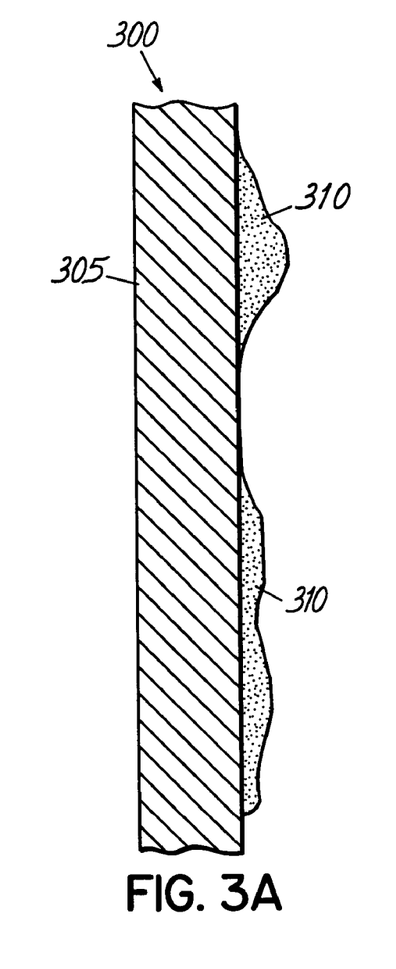
FIG. 3A is a schematic cross-sectional view of a system component containing a material deposit in accordance with an embodiment of the invention.

FIG. 3A schematically shows a cross-sectional view of a system component 300 containing a material deposit 310 in accordance with an embodiment of the invention. The system component 300 has a non-continuous material deposit 310 formed onto system component material 305.

Figure 3B:
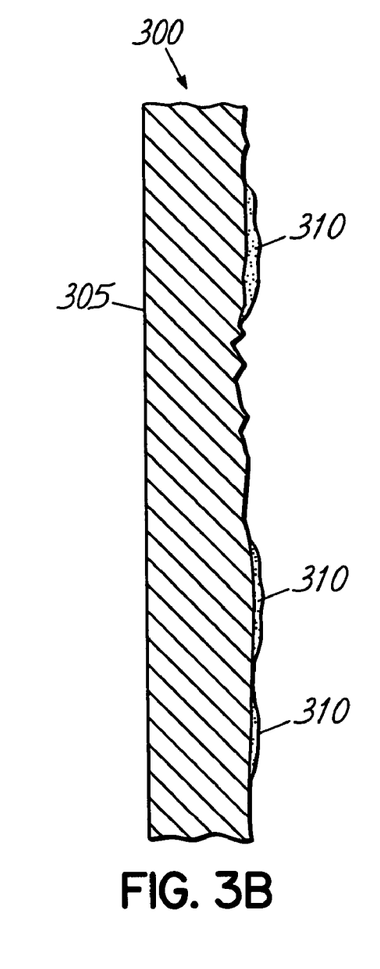
FIG. 3B is a schematic cross-sectional view of an eroded system component in accordance with an embodiment of the invention.

FIG. 3B schematically shows a cross-sectional view of an eroded system component in accordance with an embodiment of the invention. The quartz system component 300 has been exposed to a reactant gas in a cleaning process, resulting in an eroded system component 300 in FIG. 3B, where the deposit 310 has been substantially removed from the system component material 305. The cleaning process resulted in moderate erosion of system component material 305, especially where the material deposit 310 was thin or was absent.

Figure 3C:
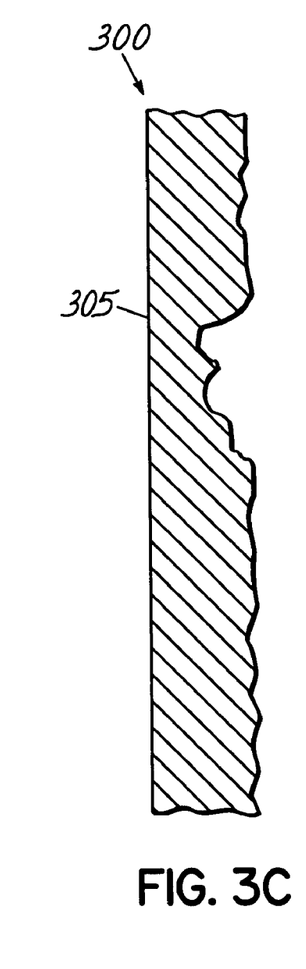
FIG. 3C is a schematic cross-sectional view of another eroded system component in accordance with an embodiment of the invention.

FIG. 3C schematically shows cross-sectional view of another eroded system component in accordance with an embodiment of the invention. The system component 300 in FIG. 3C has been exposed to a longer cleaning process than the system component 300 in FIG. 3B for complete removal of material deposit 310, resulting in increased erosion of the system component material 305. The increased erosion can lead to shorter lifetime and more frequent replacement of the system component 300.

Referring to FIGS. 3A-3C, the present invention can prevent extensive erosion of the system component material 305. For example, it may be desirable to stop the process when the material deposit 310 has been substantially removed from the system component material 305, as shown in FIG. 3B, thereby preventing further erosion of the system component material 305, as shown in FIG. 3C. The monitoring system may, for example, detect the relative amount of the erosion product for the system component material versus the amount of the erosion product for the material deposit such that the system controller can operate to stop the process upon reaching a predetermined relative amount.

Figure 4:
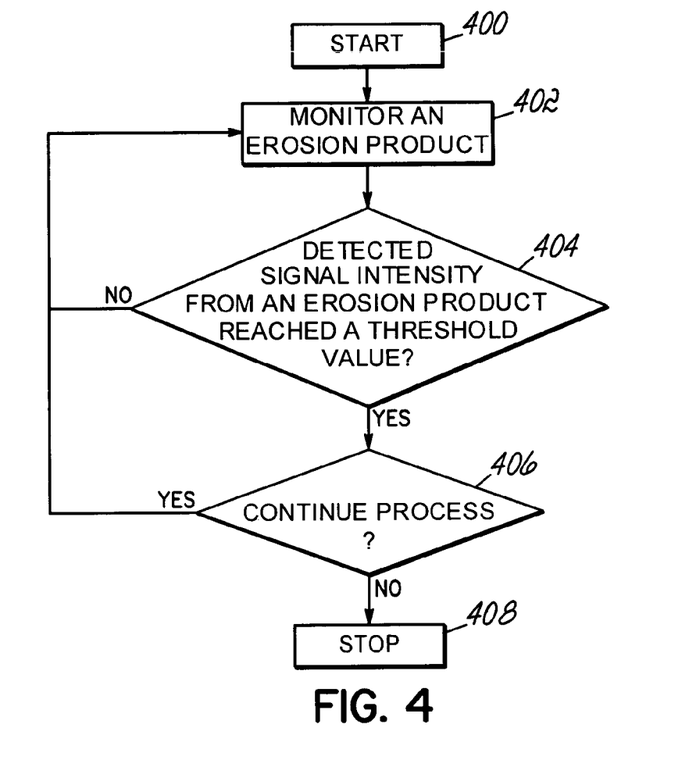
FIG. 4 is a flowchart showing a method of monitoring status of a system component in a processing system in accordance with an embodiment of the invention.

FIG. 4 is a flowchart showing a method of monitoring status of a system component in a processing system according to an embodiment of the invention. In 400, the process is started. The process may be a preparation or production process that is performed in a chamber and affects status of a system component. For example, the process may utilize a reactant gas and be any type of deposition or etching process performed on a substrate in a chamber, or the process may be a chamber conditioning process or a chamber cleaning process used to prepare the chamber for semiconductor processing. In 402, the process performed in the chamber is monitored by a chamber protection system. The monitoring can, for example, be based on a light absorption signal or a mass signal from an erosion product. During processing in the chamber, materials used for processing can be deposited or removed from the system component (and other surfaces inside the process chamber). This can alter the signal from an erosion product from etching of a system component material as the process continues in the process chamber. This change in the signal can be detected by the chamber protection system and correlated to a status of the system component. In 404, if the detected signal intensity from an erosion product has not reached a threshold value, the process is continued in 402, or if the signal in 404 has reached a threshold value, a decision is made in 406 whether to continue the process in 402 or to stop the process in 408.

A signal intensity from an erosion product can be monitored to determine an endpoint of a process. Correlation of a signal intensity to an endpoint of a process can be carried out by test process that is performed while detecting a signal intensity and monitoring status of a system component. Status of a system component can, for example, be evaluated by inspecting the system component during the test process and correlating the inspected results to a detected threshold intensity recorded when a desired endpoint of the process is observed. The threshold intensity may be a fixed intensity value, or a ratio of measured signal intensity and initial signal intensity (measured at the start of the process).

Figure 5A:
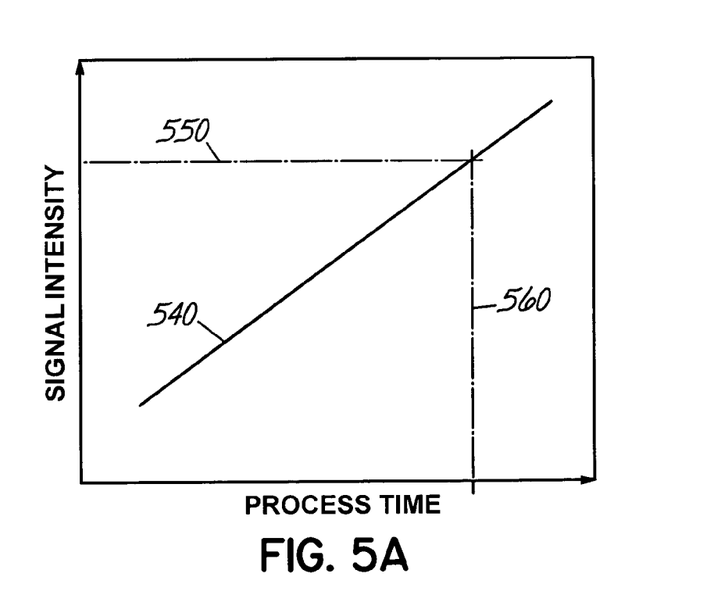
FIG. 5A is a graph showing signal intensity as a function of processing time for monitoring status of a system component in accordance with an embodiment of the invention.

FIG. 5A is a graph showing signal intensity as a function of processing time for monitoring a system component during a process in accordance with an embodiment of the invention. The system component can, for example, contain quartz. The process can, for example, be a cleaning process where a quartz system component containing a material deposit is exposed to a reactant gas. The signal can, for example, be a light absorption signal or a mass signal from a Si-containing (e.g., $SiF_4$) erosion product. As seen by the curve 540, the detected signal intensity generally increases as the cleaning process takes place, due to removal of a material deposit from the system component and increased exposure of the system component material to reactant gas that leads to an increased amount of an erosion product in the process chamber. While the curve 540 in FIG. 5A shows a substantial linear increase in signal intensity, it is to be understood that the signal intensity curve depends on the characteristics of the cleaning process and may be non-linear. As also seen in FIG. 5A, a threshold intensity 550 is detected at time 560 when the system component is known to be at an acceptable clean level for a desired process. It is to be understood that an acceptable clean level may vary depending on the production process to be performed in the chamber.

Figure 5B:
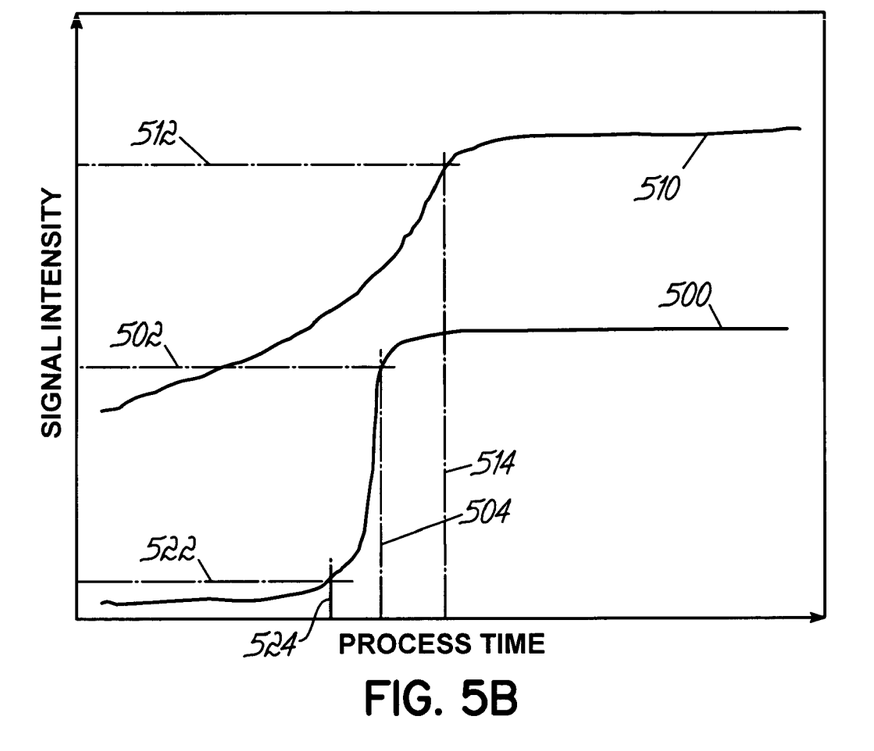
FIG. 5B is a graph showing signal intensity as a function of processing time for monitoring status of a system component in accordance with an embodiment of the invention.

FIG. 5B is a graph showing signal intensity as a function of processing time for monitoring a system component during a process according to an embodiment of the invention. The process can, for example, be a cleaning process where a system component containing a material deposit is exposed to a reactant gas. The signal can, for example, be a light absorption signal or a mass signal from an erosion product. The signal in curve 500 can, for example, correspond to a cleaning process performed on a system component having a continuous and relatively uniform material deposit (e.g., FIG. 2A). For example, the increased signal intensity 522 detected at time 524 can indicate onset of exposure of a system component material to a reactant gas. Threshold intensity 502 is detected at time 504 during the cleaning process, and at longer processing time, the signal in curve 500 becomes saturated. Threshold intensity 502 at time 504 can correspond to a signal intensity detected at a time when a desired status (e.g., clean level) of the system component has been achieved, for example, near complete removal of a material deposit from the system component (e.g., FIG. 2B), where a desired clean level has been achieved. If the cleaning process is carried out past time 504, erosion of the system component can occur (e.g., FIGS. 2C and 2D).

The signal in curve 510 can, for example, correspond to a cleaning process performed on a system component having a (single or multiple) non-continuous material deposit (e.g., FIG. 3A). Removal of a non-continuous material deposit can be indicated by an increasing signal intensity from the start of the cleaning process. Threshold intensity 512 is detected at time 514 during the cleaning process, and at longer processing time, the signal in curve 510 becomes saturated. Threshold intensity 512 at time 514 can correspond to substantial removal of a material deposit from the system component (e.g., FIG. 3B), where a desired clean level has been achieved. Unlike in the cleaning process monitored by curve 500, parts of the system component are etched in the cleaning process monitored by curve 510, resulting in erosion of the system component.

Returning to FIG. 4, as the signal intensity is detected in 402 during the process, the controller compares in 404 the detected signal intensity with prior stored signal intensity, and determines whether the detected signal intensity has reached the predetermined threshold intensity. When the signal threshold intensity is not yet detected, the monitoring returns to 402, and the process continues. When the threshold signal intensity is detected, a decision is made in 406 whether to continue the process in 402, or to stop the process in 408. Alternatively, the decision in 406 to continue the process may include adjustment of process parameters to enter a second phase of a process, which is then monitored until a second threshold value is reached. For example, temperature and/or reactant gas concentration could be lowered to effect a more gentle cleaning environment.

Figure 5C:
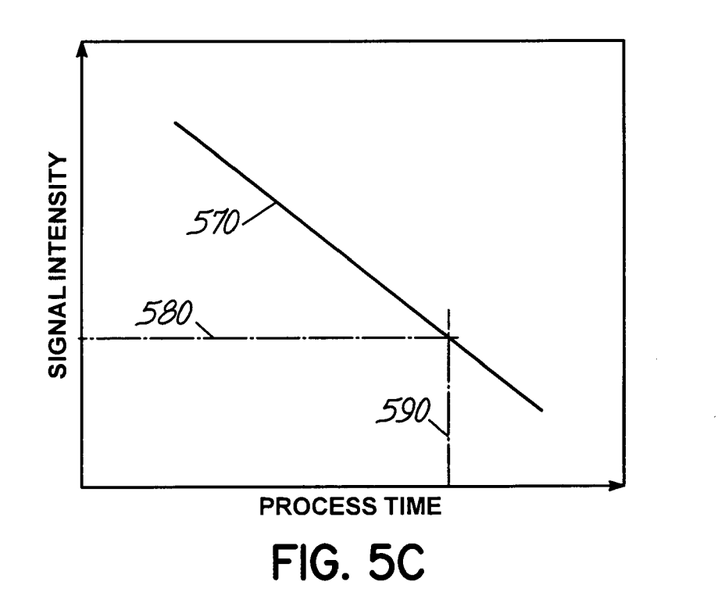
FIG. 5C is a graph showing signal intensity as a function of processing time for monitoring status of a system component in accordance with an embodiment of the invention.

FIG. 5C is a graph showing signal intensity as a function of processing time for monitoring a system component during a process according to an embodiment of the invention. The process can, for example, be a chamber conditioning process, a substrate film formation process, or a substrate etch process, where a clean system component is exposed to a reactant gas. The signal can, for example, be a light absorption signal or a mass signal from an erosion product. As seen by the curve 570, the detected signal intensity generally decreases as the process takes place, due to formation of a material deposit on the system component and thus decreased exposure of the system component material to the reactant gas, which leads to a decreased amount of a quartz erosion product in the process chamber. By way of example only, in a batch process chamber for depositing tungsten on a substrate from a tungsten hexafluoride precursor, a quartz system component may generate an $SiF_4$ reaction product upon exposure to the fluorine gas generated from dissociation of the precursor. Tungsten will also deposit on the quartz system component. However, a large tungsten deposit build-up on the system component may eventually flake off, resulting in non-conformal deposition on the substrate. Thus, monitoring the status of the system component erosion product can provide the necessary input for a determination that complete or near complete coating of the system component has occurred, at which time the controller may halt the deposition process to perform a process chamber cleaning process.

While the curve 570 in FIG. 5A shows a substantial linear decrease in signal intensity, it is to be understood that the signal intensity curve depends on the characteristics of the process and may be non-linear. As also seen in FIG. 5C, a threshold intensity 580 is detected at time 590 when the system component is known to be at a known status for a desired process. It is to be understood that the known status may vary depending on the production process to be performed in the chamber.

Obviously, numerous modifications and variations of the present invention are possible in light of the above teachings. It is therefore to be understood that within the scope of the appended claims, the invention may be practiced otherwise that is specifically described herein. For example, the process steps described herein and recited in the claims may be performed in a sequence other than the sequence in which they are described or listed herein. As should be understood by one of ordinary skill in the art, only those process steps necessary to the performance of a later process steps are required to be performed before the later process step is performed.

What is claimed is:

1. A method of monitoring status of a system component in a processing system for processing semiconductor substrates, the system component being different than the semiconductor substrates processed in the processing system, the method comprising:
   exposing the system component to a reactant gas during a process, wherein the system component consists of a material selected from quartz, $Al_2O_3$, SiN, or SiC, and wherein the reactant gas is capable of etching the system component material to form an erosion product thereof;
   monitoring the processing system for release of the erosion product during the process; and
   stopping the process when the monitoring indicates release of the erosion product at a threshold value.

2. The method according to claim 1, wherein the exposing comprises the system component having a material deposit thereon, and wherein the process is a cleaning process for removing the material deposit from the system component.

3. The method according to claim 1, wherein the exposing comprises the system component having a material deposit thereon containing at least one of Si, SiGe, SiN, $SiO_2$, doped Si, $HfO_2$, $HfSiO_x$, $ZrO_2$, and $ZrSiO_x$, and wherein the process is a cleaning process for removing the material deposit from the system component.

4. The method according to claim 1, wherein the process comprises at least one of a chamber cleaning process, a chamber conditioning process, a substrate etching process, and a substrate film formation process.

5. The method according to claim 1, wherein the exposing comprises the reactant gas containing a halogen-containing gas for cleaning the system component during a chamber cleaning process.

6. The method according to claim 1, wherein the exposing comprises the reactant gas containing at least one of $ClF_3$, $F_2$, $NF_3$, and HF for cleaning the system component during a chamber cleaning process.

7. The method according to claim 1, wherein the exposing comprises the reactant gas containing at least one of a silicon-containing gas and a nitrogen-containing gas for conditioning the system component during a chamber conditioning process.

8. The method according to claim 1, wherein the exposing comprises the reactant gas containing at least one of dichlorosilane and $NH_3$ for conditioning the system component during a chamber conditioning process.

9. The method according to claim 1, wherein the exposing comprises the reactant gas containing a halogen-containing gas for etching substrates during a substrate etching process.

10. The method according to claim 1, wherein the exposing comprises the reactant gas containing HF for etching substrates during a substrate etching process.

11. The method according to claim 1, wherein the exposing comprises the reactant gas containing at least one of a silicon-containing gas and an nitrogen-containing gas for depositing a film during a substrate film formation process.

12. The method according to claim 1, wherein the exposing comprises the reactant gas containing at least one of NO and tetraethyl orthosilicate for depositing a film during a substrate film formation process.

13. The method according to claim 1, further comprising operating the processing system at a temperature between about 100° C. and about 1000° C. during the exposing.

14. The method according to claim 1, further comprising operating the processing system at a chamber pressure between about 10 mTorr and about 760 Torr during the exposing.

15. The method according to claim 1, wherein the system component includes quartz, and further comprising operating the processing system at a chamber pressure of about 200 mTorr to about 760 Torr and a temperature of about 200° C. to about 800° C. during the exposing.

16. The method according to claim 1, wherein the monitoring comprises using an optical monitoring system to detect light absorption of the erosion product.

17. The method according to claim 16, wherein the monitoring further comprises determining if the intensity level of the light absorption has reached the threshold value.

18. The method according to claim 1, wherein the monitoring comprises using a mass sensor to detect a mass signal from the erosion product.

19. The method according to claim 18, wherein the monitoring further comprises determining if an intensity level of the mass signal has reached the threshold value.

20. The method according to claim 1, wherein the system component consists of quartz, SiN or SiC and the reactant gas comprises a halide-containing gas whereby the exposing forms a silicon halide erosion product, and wherein the monitoring comprises monitoring release of the silicon halide erosion product.

* * * * *